US00RE47790E

(19) United States
(12) Reissued Patent
Bult et al.

(10) Patent Number: US RE47,790 E
(45) Date of Reissued Patent: Dec. 31, 2019

(54) SYSTEMS AND METHODS FOR SYNTHETIC JET ENHANCED NATURAL COOLING

(71) Applicant: General Electric Company, Schenectady, NY (US)

(72) Inventors: Jeffrey Russell Bult, Grand Rapids, MI (US); Mehmet Arik, Uskudar Istanbul (TR); William Dwight Gerstler, Niskayuna, NY (US); Yogen Vishwas Utturkar, Niskayuna, NY (US)

(73) Assignee: General Electric Company, Schenectady, NY (US)

(21) Appl. No.: 13/956,904

(22) Filed: Aug. 1, 2013

Related U.S. Patent Documents

Reissue of:
(64) Patent No.: 7,990,705
Issued: Aug. 2, 2011
Appl. No.: 12/118,435
Filed: May 9, 2008

(51) Int. Cl.
*H05K 7/20* (2006.01)
*F28F 7/00* (2006.01)
(Continued)

(52) U.S. Cl.
CPC ..... *F15D 1/08* (2013.01); *H01L 23/4735* (2013.01); *H05K 7/20909* (2013.01); *H01L 2924/0002* (2013.01)

(58) Field of Classification Search
CPC ..... F15D 1/08; F15D 1/009; F15D 1/0095; F15D 1/10; H01L 23/4735
(Continued)

(56) References Cited

U.S. PATENT DOCUMENTS 1,175,461 A * 3/1916 LeBlanc ..... F04F 5/469 417/163
6,123,145 A * 9/2000 Glezer et al. ..... 165/104.33
(Continued)

FOREIGN PATENT DOCUMENTS

EP 1762725 A1 3/2007
JP 62149158 A * 7/1987 ..... H01L 23/46
(Continued)

OTHER PUBLICATIONS

M. O. Muller et al., Micromachined Acoustic Resonators for Microjet Propulsion, AIAA, AIAA 2000-0547, 2000 , pp. 1-11.*
(Continued)

*Primary Examiner* — Linh M Nguyen
(74) *Attorney, Agent, or Firm* — Ziolkowski Patent Solutions Group, SC; Jean K. Testa

(57) ABSTRACT

A method and system for increasing cooling of an enclosure is provided. The component enclosure includes one or more sidewalls defining a volume, the sidewalls are configured to substantially surround a heat generating component positioned within the volume. The component enclosure further includes a synthetic jet assembly positioned adjacent at least one of the sidewalls. The synthetic jet assembly includes at least one synthetic jet ejector having a jet port. The jet port is aligned at least one of perpendicularly, parallelly, and obliquely with a surface of the at least one sidewall. The synthetic jet assembly is configured to direct a jet of fluid through the port at least one of substantially parallel to the
(Continued)

surface, perpendicularly onto the surface, and obliquely toward the surface.

17 Claims, 7 Drawing Sheets

(51) Int. Cl.
*F04B 17/00* (2006.01)
*F15D 1/08* (2006.01)
*H01L 23/473* (2006.01)

(58) Field of Classification Search
USPC ..... 361/679.46–679.54, 688–723; 165/80.2–80.3; 257/712–713, 721–722; 174/526, 547–548, 16.1; 454/184; 239/102.2
See application file for complete search history.

(56) References Cited

U.S. PATENT DOCUMENTS 6,588,497 B1 7/2003 Glezer et al.
6,722,581 B2 4/2004 Saddoughi
6,937,472 B2 * 8/2005 Pokhama ..... 361/700
7,023,697 B2 * 4/2006 Pokharna et al. ..... 361/695
7,055,329 B2 6/2006 Martens et al.
7,281,785 B2 * 10/2007 Palifka ..... B41J 2/17596 347/85
7,307,841 B2 * 12/2007 Berlin et al. ..... 361/699
7,336,486 B2 * 2/2008 Mongia ..... 361/695
7,527,086 B2 * 5/2009 Wang ..... F15D 1/08 165/104.31
7,606,029 B2 * 10/2009 Mahalingam ..... G06F 1/20 165/104.33
7,714,433 B2 * 5/2010 Campini et al. ..... 257/722
7,768,779 B2 * 8/2010 Heffington ..... F15D 1/009 165/104.33
8,030,886 B2 * 10/2011 Mahalingam ..... H01M 10/42 320/107
8,430,644 B2 * 4/2013 Mahalingam ..... F28F 13/02 165/104.33
2003/0075615 A1 4/2003 Saddoughi
2003/0222341 A1 * 12/2003 Oberhardt et al. ..... 257/706
2004/0190305 A1 9/2004 Arik et al.
2005/0121171 A1 * 6/2005 Mukasa et al. ..... 165/80.3
2006/0138905 A1 * 6/2006 Gonzales et al. ..... 310/331
2006/0267184 A1 * 11/2006 Kinsman et al. ..... 257/712
2007/0023169 A1 * 2/2007 Mahalingam ..... F25D 17/02 165/104.28
2008/0087771 A1 * 4/2008 Boespflug et al. ..... 244/207
2008/0277103 A1 * 11/2008 Yamada et al. ..... 165/104.33
2009/0174999 A1 * 7/2009 Sauciuc et al. ..... 361/679.48
2010/0018675 A1 * 1/2010 Aarts et al. ..... 165/104.19

FOREIGN PATENT DOCUMENTS

JP 2008008230 A 1/2008
WO 9926457 A1 5/1999

OTHER PUBLICATIONS

Yuanchang Liang et al., Design of synthetic jet actuator based on FSM composite, The Institute of Electrical Engineers, Stevenage, GB, 2005 and Smart Structures and Materials 2005: Industrial and Commercial Applications of Smart Structures Technologies, Mar. 9, 2005, San Diego, CA, USA, vol. 5762, No. 1, pp. 179-186, Proceedings of the SPIE—The International Society for Optical Engineering.
European Search Report, dated Feb. 9, 2010, from the European Patent Office for co-pending Application No. EP09159255 (7 pages).

* cited by examiner

SYSTEMS AND METHODS FOR SYNTHETIC JET ENHANCED NATURAL COOLING

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATIONS*

*Notice: More than one reissue application has been filed for the reissue of U.S. Pat. No. 7,990,705. The reissue applications are U.S. application Ser. No. 13/956,904 (the present reissue application), which is a reissue application of U.S. Pat. No. 7,990,705; U.S. application Ser. No. 14/593,087, which is a divisional reissue application of U.S. application Ser. No. 13/956,904; and U.S. application Ser. Nos. 15/070,427 and 15/070,483, which are divisional reissue applications of U.S. application Ser. No. 14/593,087.*

BACKGROUND OF THE INVENTION

This invention relates generally to component enclosures and, more particularly, to systems and methods for enhancing natural convection cooling of component enclosures.

In at least some known application areas, it is important for components and systems to be light weight and reliable, for example, systems, including the various digital and power electronics systems that provide computational power and electrical power to an aircraft. Passive cooling of components is known to be reliable. However, passive cooling is also the least effective cooling method from a cooling performance point of view, typically resulting in a larger system for a given amount of cooling. Some options that are used to extend the capability of passive cooling include extended surfaces and new material with higher thermal conductivity. Extended surfaces increase the heat transfer area. Extended surfaces include fins, ribs, and other protrusions. Materials with higher thermal conductivity decrease the thermal resistance of the enclosure. Both extended surfaces and new higher thermal conductivity material achieve higher performance without affecting the simplicity and reliability of natural convection. However, they have performance limitations.

When the loss density extends that where passive cooling is practical, then active gas or liquid cooling is employed. Active gas or liquid cooling may result in a lighter, but less reliable system. When improvements made using extended surfaces and advanced materials reach their limit, active cooling, using a fan or other gas cooling device, can be used wherein a cooling gas is forced across and/or against the surface, reducing the fluid film thermal resistance substantially compared to natural convection. In addition to taking cooling air available from the immediate vicinity, the cooling gas in a forced convection approach could be conditioned, making it colder, and thus more effective. A further option is liquid cooling. Liquids, typically are a more effective heat transfer fluid than gas, and thus can remove more heat. Active gas cooling and liquid cooling are less reliable and more complex than a passive cooling system and they both require systems with moving parts which are inherently less reliable than a passive cooling approach.

BRIEF DESCRIPTION OF THE INVENTION

In one embodiment, a component enclosure includes one or more sidewalls defining a volume, the sidewalls are configured to substantially surround a heat generating component positioned within the volume. The component enclosure further includes a synthetic jet assembly positioned adjacent at least one of the sidewalls. The synthetic jet assembly includes at least one synthetic jet ejector having a jet port. The jet port is aligned at least one of perpendicularly, parallelly, and obliquely with a surface of the at least one sidewall. The synthetic jet assembly is configured to direct a jet of fluid through the port at least one of substantially parallel to the surface, perpendicularly onto the surface, and obliquely toward the surface.

In another embodiment, method of increasing cooling of an enclosure includes positioning a synthetic jet assembly adjacent at least one of a plurality of sidewalls of the enclosure wherein the synthetic jet assembly includes at least one synthetic jet ejector having a jet port. The jet port is aligned at least one of perpendicularly, parallelly, and obliquely with a surface of the at least one sidewall and the synthetic jet assembly is configured to direct a jet of fluid through the jet port at least one of substantially parallel to the surface, perpendicularly onto the surface, and obliquely toward the surface.

In yet another embodiment, an electronic component system includes a component enclosure including a plurality of sidewalls defining a volume, a heat generating component positioned within the volume, and a synthetic jet assembly positioned adjacent at least one of the plurality of sidewalls. The synthetic jet assembly includes at least one synthetic jet ejector having a jet port. The jet port is aligned at least one of perpendicularly, parallelly, and obliquely with a surface of the at least one sidewall. The synthetic jet assembly is configured to direct a jet of fluid through the jet port at least one of substantially parallel to said surface, perpendicularly onto said surface, and obliquely toward said surface.

BRIEF DESCRIPTION OF THE DRAWINGS

FIGS. 1-6 show exemplary embodiments of the method and systems described herein.

FIG. 1 is a perspective view of a known natural draft cooled component enclosure;

FIG. 2 is a heat profile map of the enclosure shown in FIG. 1;

FIG. 3 is a component enclosure in accordance with an exemplary embodiment of the present invention;

FIG. 4 is a heat profile map of the enclosure shown in FIG. 3;

FIG. 6 is a cross-sectional view of a synthetic jet assembly in accordance with another exemplary embodiment of the present invention.

DETAILED DESCRIPTION OF THE INVENTION

The following detailed description illustrates embodiments of the invention by way of example and not by way of limitation. It is contemplated that the invention has general application to enhancing cooling and disrupting laminar flow in industrial, commercial, and residential applications.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Figure 1:
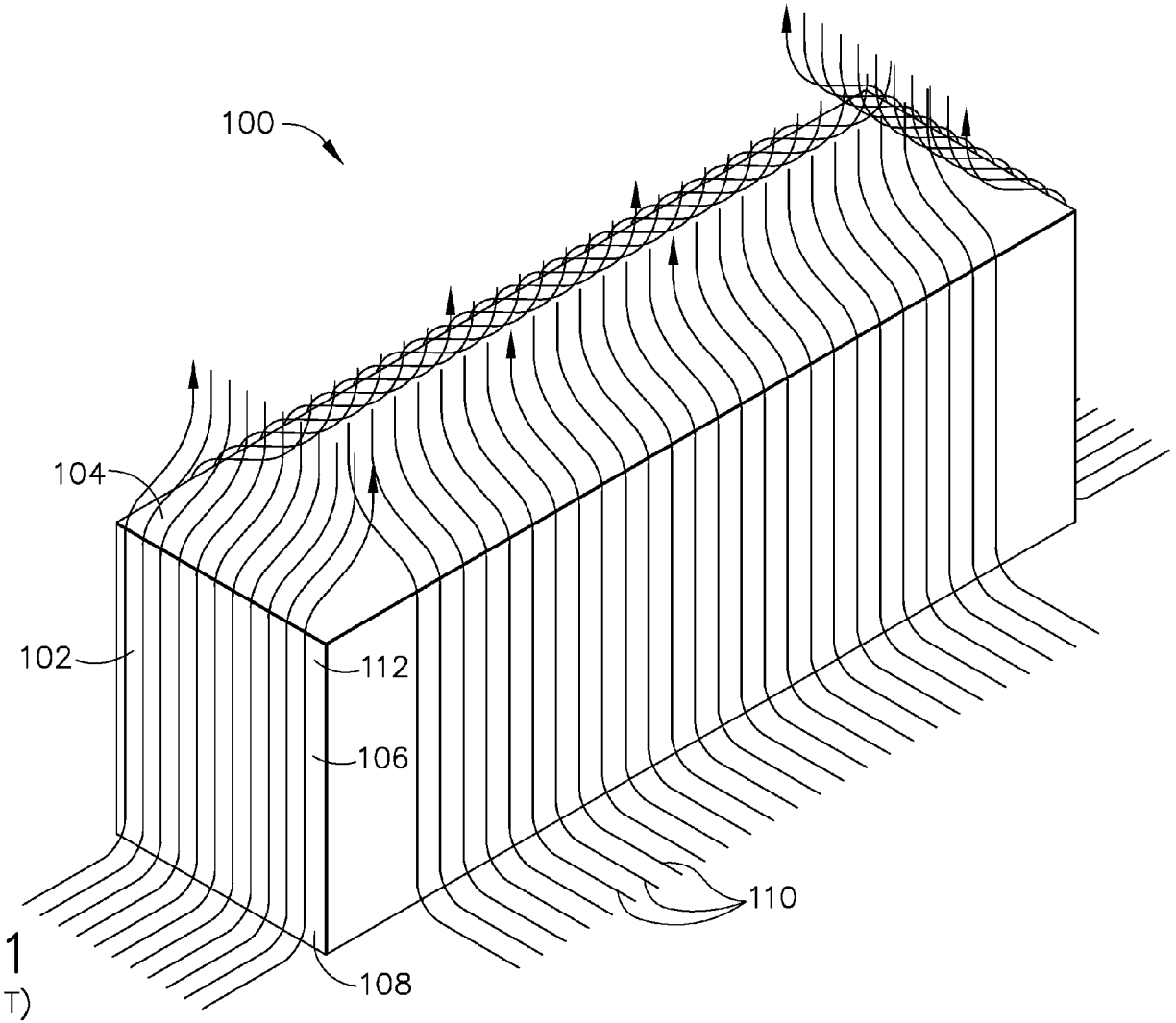
FIG. 1 (PRIOR ART)

FIG. 1 is a perspective view of a known natural draft cooled component enclosure 100. Enclosure 100 includes a plurality of sidewalls 102 and a top wall 104 forming an enclosed volume in which heat generating components (not shown) may be located. Air surrounding enclosure 100 removes heat a surface 106 of sidewalls 102 typically by convection. Air near a lower portion 108 of sidewall 102 receives heat generated by components in enclosure 100 and passed through sidewall 102 by conduction. The warmed air rises adjacent to sidewall 102 forming streams 110 of air rising due to natural convection. As the air rises adjacent to sidewall 102 the air tends to receive more heat from upper portions 112 of sidewall 102. As the air receives more heat, its temperature increases and its ability to receive more heat diminishes, thereby reducing its effectiveness as a cooling media for enclosure 100. A total amount of heat that can be removed from enclosure 100 defines the amount of heat that may be generated by the heat-generating components without causing a failure of the components. Because the heat removal capability of natural circulation cooling is limited, other heat-removal methods are often employed as either the primary cooling method or at least as a supplemental cooling method. For example, some known component enclosures include water-cooling, fans, and/or forced air cooling.

Figure 2:
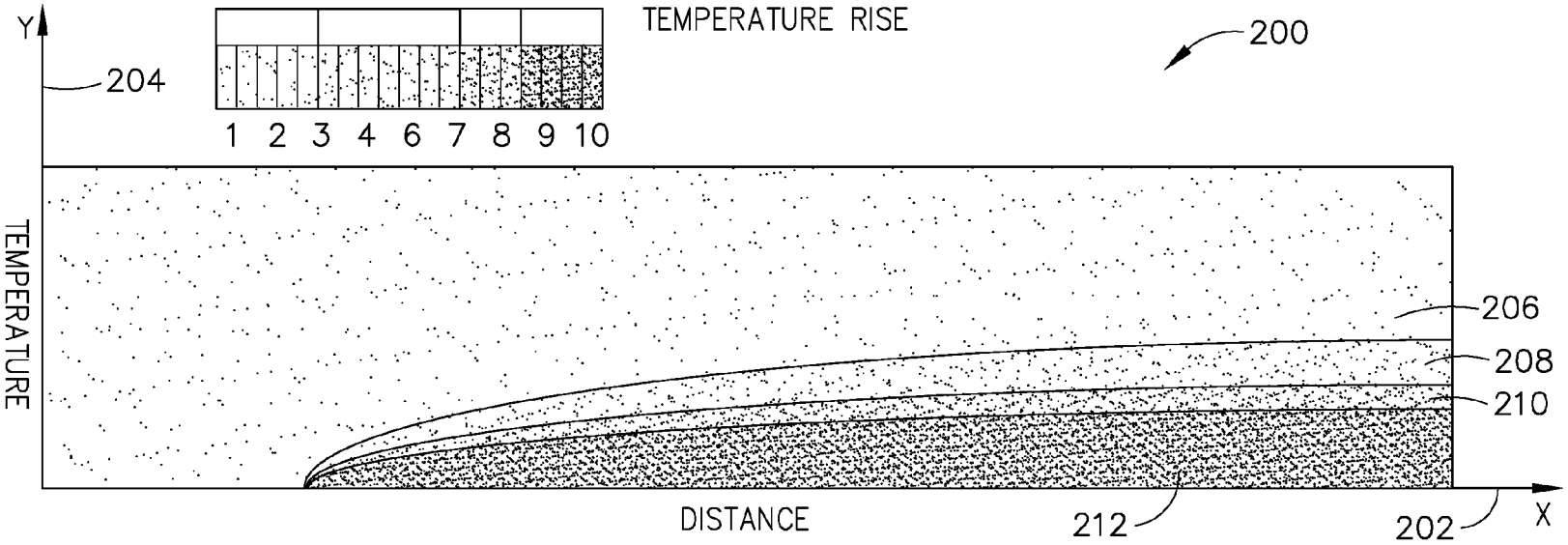
FIG. 2 (PRIOR ART)

FIG. 2 is a heat profile map 200 of enclosure 100 (shown in FIG. 1). Map 200 includes an x-axis 202 representing a position along the height of sidewall 102 (shown in FIG. 1). A y-axis 204 represents a distance extending away from sidewall 102. A first temperature gradation 206 illustrates a first temperature away from enclosure 200 and proximate lower portion 108. A second temperature gradation 208 illustrates a laminar layer of air flow that includes a greater amount of heat than gradation 206. A third temperature gradation 210 illustrates a laminar layer of air flow that includes a greater amount of heat than gradation 208. A fourth temperature gradation 212 illustrates a laminar layer of air flow that includes a greater amount of heat than gradation 210. Gradation 212 is at a higher temperature than gradations 206, 208, and 210 and the higher temperature reduces the cooling effectiveness of gradation 212.

Figure 3:
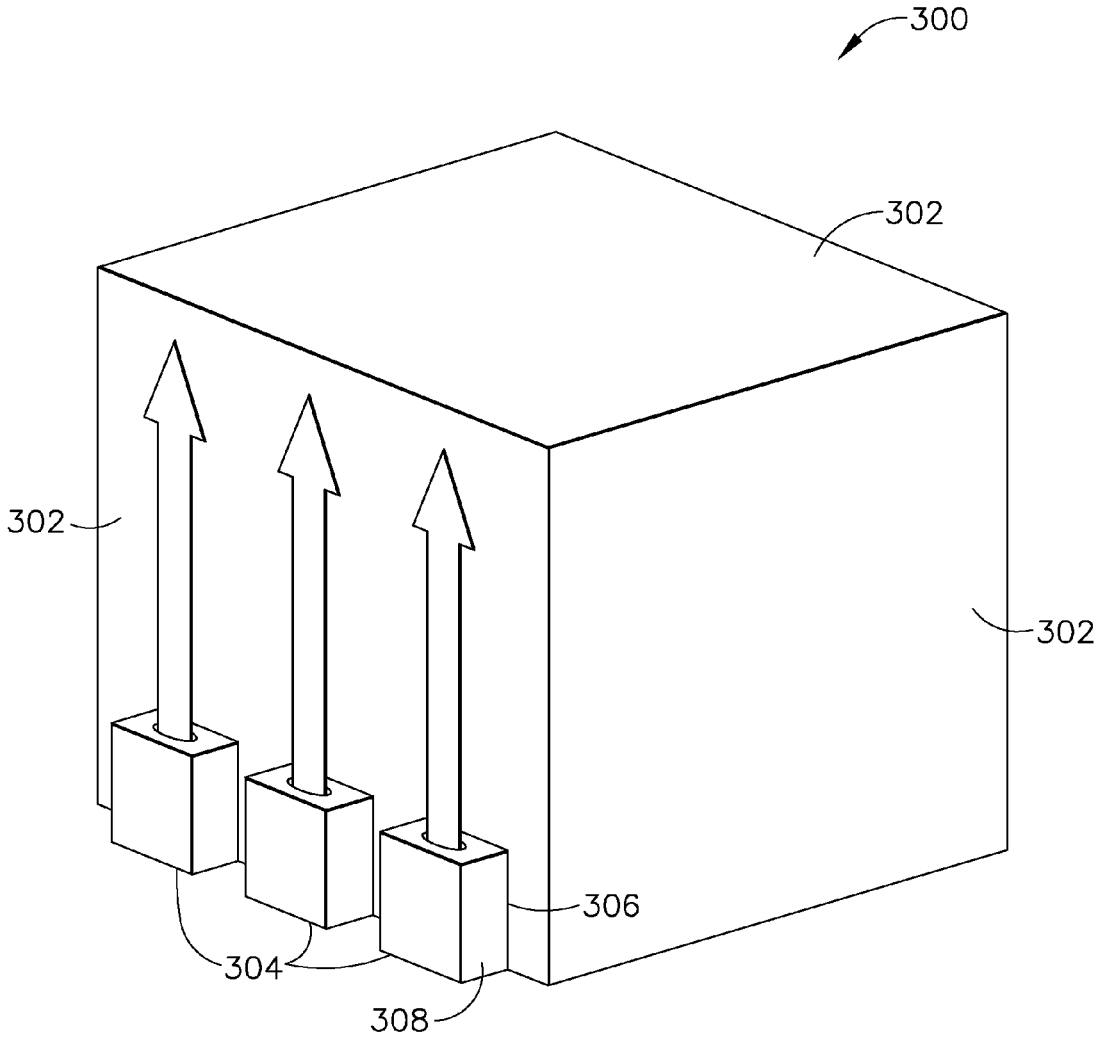

FIG. 3 is a component enclosure 300 in accordance with an exemplary embodiment of the present invention. In the exemplary embodiment, enclosure 300 includes one or more sidewalls 302 defining a volume (not shown) configured to substantially surround a heat generating component (not shown) positioned within the internal volume. Enclosure 300 includes a synthetic jet assembly 304 positioned adjacent at least one of sidewalls 302. Synthetic jet assembly 304 includes at least one jet port 306 extending through a housing 308. In the exemplary embodiment, jet port 306 is aligned substantially perpendicularly with respect to respective sidewall 302 such that a jet of fluid is ejector substantially parallel to respective sidewall 302. In other embodiments jet port 306 may be aligned parallelly and obliquely with respect to sidewall 302 such that jet port 306 directs a jet of fluid perpendicularly towards sidewall 302 or obliquely towards sidewall 302 respectively.

In the exemplary embodiment, enclosure 300 includes at least one sidewall 302 that includes an extended surface, such as a rib, a fin, or other protrusion from the surface of sidewall 302 that tends to increase the surface area of sidewall 302 that is in contact with ambient air outside of enclosure 300. When sidewall 302 includes an extended surface, jet port 306 may be aligned parallelly, perpendicularly, or obliquely with a surface of the extended surface.

Housing 308 may be a separate device that is couplable to enclosure 300, for example, as a retrofit addition to enclosure 300 or as a separate addition to enclosure 300 during an initial assembly of enclosure 300. In other alternative embodiments, synthetic jet assembly housing 308 is formed integrally with a surface of sidewall 302.

Housing 308 may also include a plurality of jet ports 306 to accommodate a synthetic jet assembly 304 having multiple synthetic jet ejectors (not shown in FIG. 3) in a single housing 308. Additionally, housing 308 may include a plurality of jet ports 306 to accommodate multiple synthetic jet assemblies 304 in a single housing 308. In an embodiment of the present invention, multiple synthetic jet ejectors may be coupled together in serial flow communication in a single synthetic jet assembly 304. Such an arrangement provides an additional pressure increase to propel the jet exiting jet port 306 a greater distance and/or in a more coherent formation for a greater distance than a single synthetic jet ejector in a synthetic jet assembly 304.

Figure 4:
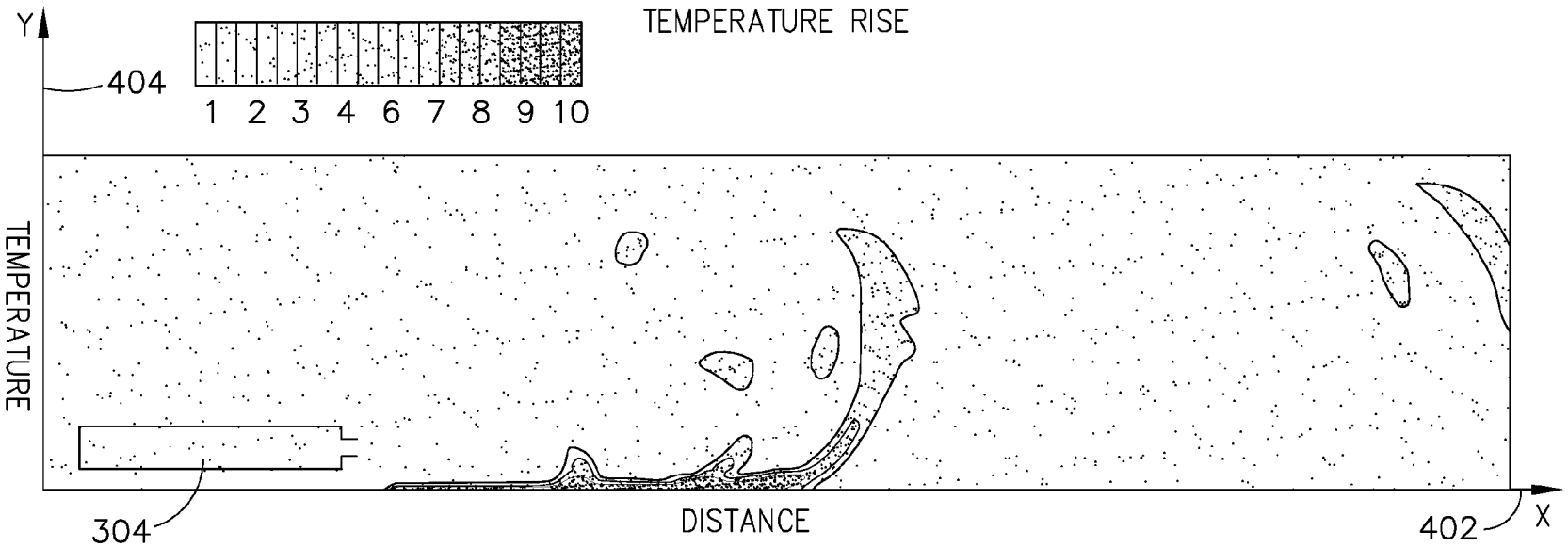

FIG. 4 is a heat profile map 400 of enclosure 300 (shown in FIG. 3). Map 400 includes an x-axis 402 representing a position along the height of sidewall 302 (shown in FIG. 3). A y-axis 404 represents a distance extending away from sidewall 302. Synthetic jet assembly 304 is configured to direct a jet of fluid substantially parallel to sidewall 302. The jet of fluid disrupts the laminar flow of fluid along a surface of sidewall 302, permitting the jet to provide additionally cooling air to the surface of sidewall 302 and permitting ambient air to reach the surface of sidewall 302 cooling sidewall 302 further.

Figure 5A:
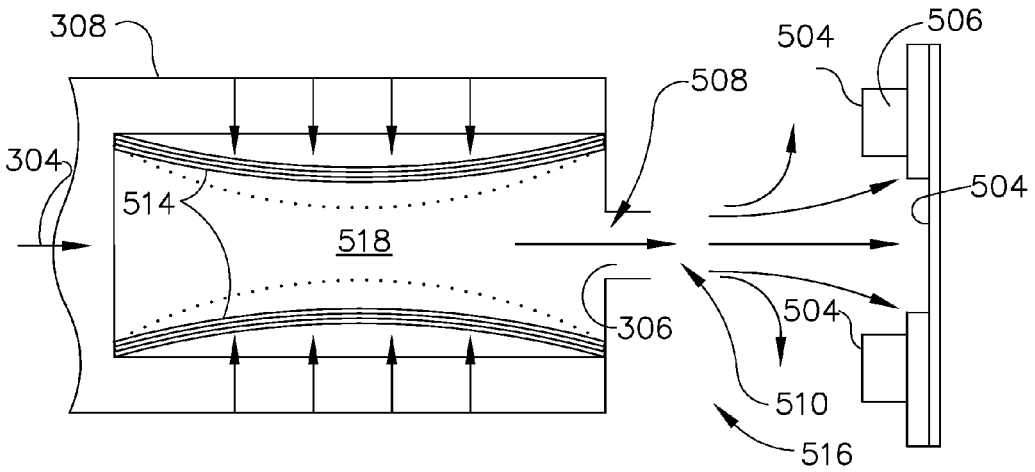
FIG. 5A is a cross-sectional view of the synthetic jet assembly shown in FIG. 3 in accordance with an exemplary embodiment of the present invention during a compression or expulsion phase.
Figure 5B:
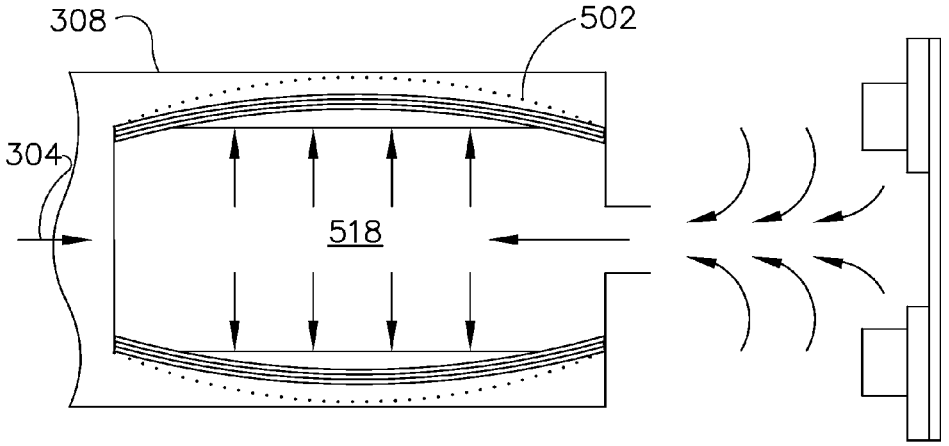
FIG. 5B is a cross-sectional view of the synthetic jet assembly shown in FIG. 3 during an expansion or ingestion phase.

FIG. 5A is a cross-sectional view of synthetic jet assembly 304 in accordance with an exemplary embodiment of the present invention during a compression or expulsion phase. FIG. 5B is a cross-sectional view of synthetic jet assembly 304 during an expansion or ingestion phase. In the exemplary embodiment, synthetic jet assembly 304 includes housing 308 and at least one synthetic jet ejector 502. Synthetic jet ejector 502 includes a jet port 306 that may be oriented perpendicularly, parallelly, or obliquely with a surface 504 of a component 506 to be cooled. Synthetic jet assembly 304 is configured to direct a flow of fluid 508 through jet port 306 that exits jet port 306 as a jet of fluid 510 that is parallel to the surface, perpendicular to the surface, or oblique toward the surface. Synthetic jet ejector 502 includes a piezoelectric actuator 514. Actuator 514 is configured to vibrate under the influence of a piezoelectric effect such that jet of fluid 510 is generated and exits jet port 306. Jet of fluid 510 may be configured such that vortex rings 516 are formed in jet of fluid 510. Vortex rings 516 aid in disrupting the laminar film that may form along a natural convective flow cooled surface. Although described as working with a gaseous media, synthetic jet assembly 304 is also able to utilize a dielectric fluid as the working fluid.

A small amount of electrical power is drawn by piezoelectric actuator 514 causing piezoelectric actuator 514 to vibrate. During a first phase of operation of synthetic jet ejector 502, shown in FIG. 5A, piezoelectric actuator 514 compresses inwardly towards cavity 518 expelling the fluid out of cavity 518 through jet port 306. During a second phase of operation of synthetic jet ejector 502, shown in FIG. 5B, piezoelectric actuator 514 expands outwardly away from cavity 518 drawing the fluid into cavity 518 through jet port 306. Piezoelectric actuator 514 is designed into synthetic jet ejector 502 such that the geometry permits the vibrating action to draw fluid through jet port 306 and into a cavity 518 and then subsequently expel the fluid out of cavity 518, again through jet port 306. The physics of suction and expulsion through jet port 306 are different. When a fluid is drawn through jet port 306, it draws the fluid from an area all around the orifice. Thus, most of the fluid volume is from fluid in the area immediately around jet port 306. When synthetic jet ejector 502 expels the fluid out of jet port 306, a jet is formed. The jet travels at a high velocity and remains intact for a substantial distance away from jet port 306.

The jet can be directed in a various ways. The jet can be directed perpendicularly to a surface. Such direction tends to provide additional local cooling to the area of the surface towards which, the jet is directed. If the jet is directed parallel to a surface, the jet not only provides direct cooling to the surface by increased fluid velocity along the surface, but it also entrains additional fluid along the periphery of the jet. Thus the amount of fluid that participates in enhancing the fluid along the surface is not only that which is expelled from synthetic jet cavity 518, but additional fluid that is entrained by the jet.

Figure 6:
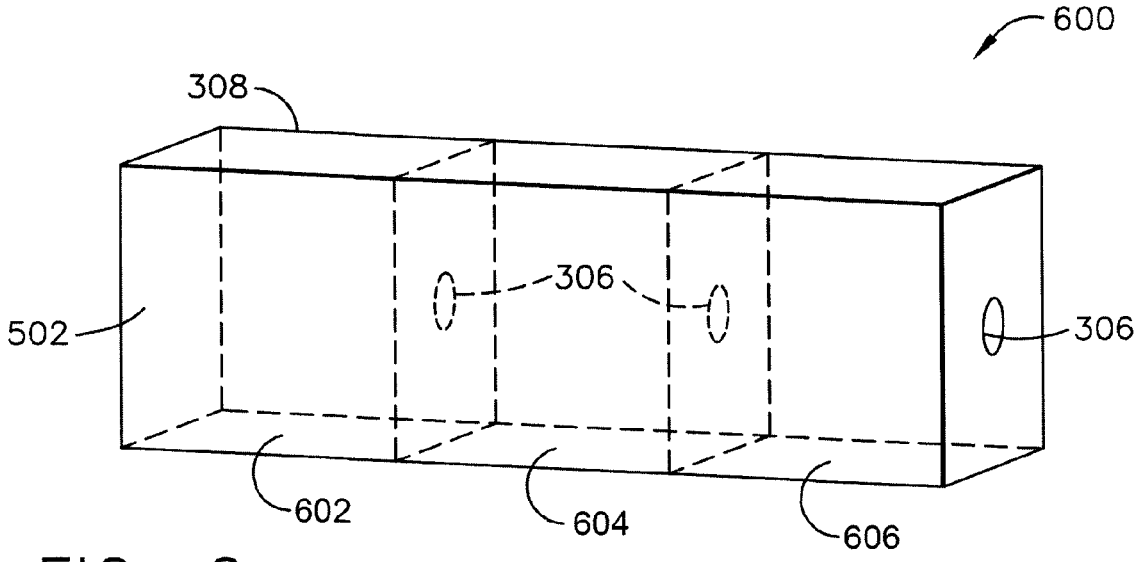

FIG. 6 is a cross-sectional view of a synthetic jet assembly 600 in accordance with another exemplary embodiment of the present invention. In the exemplary embodiment, housing 308 includes a plurality of synthetic jet ejectors 502 oriented in serial flow communication such that a flow from a first synthetic jet ejector 602 discharges into a second synthetic jet ejector 604 which in turn discharges into a third synthetic jet ejector 606. The flow generated in first synthetic jet ejector 602 is configured to be in phase with the flow being generated in second synthetic jet ejector 604, into which first synthetic jet ejector 602 discharges and second synthetic jet ejector 604 is configured to be in phase with the flow being generated in third synthetic jet ejector 606, into which second synthetic jet ejector 604 discharges. By controlling the voltage applied to each piezoelectric member associated with first synthetic jet ejector 602, second synthetic jet ejector 604, and third synthetic jet ejector 606, the flow of fluid through synthetic jet assembly 600 can be facilitated being increased in flow and/or pressure permitting an enhanced jet to be formed.

Figure 7:
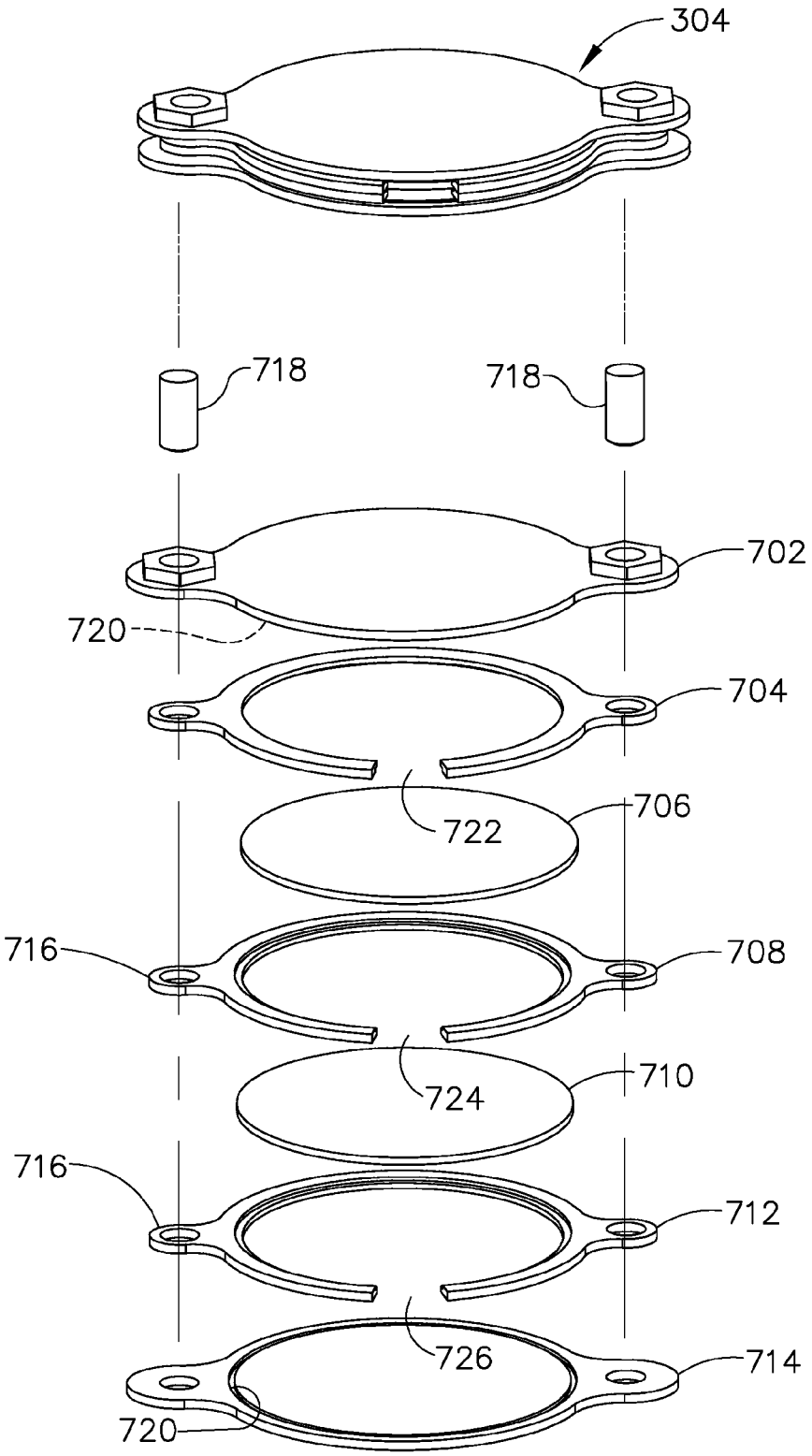
FIG. 7 is an exploded cross-sectional view of the synthetic jet assembly shown in FIG. 3 in accordance with an embodiment of the present invention.

FIG. 7 is an exploded cross-sectional view of synthetic jet assembly 304 in accordance with an embodiment of the present invention. In the exemplary embodiment, synthetic jet assembly 304 includes a top cover 702, a first spacer ring 704, a first piezoelectric actuator 706, a second spacer ring 708, a second piezoelectric actuator 710, a third spacer ring 712, and a bottom cover 714 all stacked in a sequential adjacent relationship. One or more alignment tabs 716 provide for an axial alignment of the aforementioned components and to provide for coupling the components together using respective pin connectors 718. A groove 720 inscribed in an inner face of top cover 702 and bottom cover 714 is configured to receive an o-ring (not shown) for sealing the cavity formed between top cover 702 and first piezoelectric actuator 706 and between second piezoelectric actuator 710 and bottom cover 714. A gap 722, 724, and 726 in respective spacers 704, 708, and 712 provides ingress and egress of fluid into and out of the cavities during operation.

The above-described embodiments of a method and system of applying synthetic jets to the surface cooling of electronic boxes provides a cost-effective and reliable means for enhancing natural circulation cooling of component enclosures. More specifically, the methods and systems described herein facilitate disrupting a laminar flow layer along a surface of the enclosure. In addition, the above-described methods and systems facilitate directly supplying additional cooling media to the enclosure and entraining additional fluid to provide an increased flow. As a result, the methods and systems described herein facilitate enhancing cooling of components without significant added weight and/or reliability costs in a cost-effective and reliable manner.

While the disclosure has been described in terms of various specific embodiments, it will be recognized that the disclosure can be practiced with modification within the spirit and scope of the claims.

What is claimed is:

[1. A component enclosure comprising:

one or more sidewalls defining a volume configured to substantially surround a heat generating component positioned within said volume; and a synthetic jet assembly positioned adjacent and is formed integrally with a surface of at least one of the sidewalls and external to said volume, said synthetic jet assembly including at least one synthetic jet ejector comprising a jet port, said jet port aligned at least one of perpendicularly, parallelly, and obliquely with a surface of said at least one sidewall, said synthetic jet assembly is configured to direct a jet of fluid through said port at least one of substantially parallel to said surface, perpendicularly onto said surface, and obliquely toward said surface, such that the jet of fluid flows external to said volume.]

2. An enclosure in accordance with claim [1] *3* wherein said synthetic jet assembly comprises a plurality of jet ports.

3. [An enclosure in accordance with claim 1] *A component enclosure comprising:*

*one or more sidewalls defining a volume configured to substantially surround a heat generating component positioned within said volume: and*

*a synthetic jet assembly positioned adjacent and is formed integrally with a surface of at least one of the sidewalls and external to said volume, said synthetic jet assembly including at least one synthetic jet ejector comprising a jet port, said jet port aligned at least one of perpendicularly, parallelly, and obliquely with a surface of said at least one sidewall, said synthetic jet assembly is configured to direct a jet of fluid through said port at least one of substantially parallel to said surface, perpendicularly onto said surface, and obliquely toward said surface, such that the jet of fluid flows external to said volume:* wherein said synthetic jet assembly comprises a plurality of synthetic jet ejectors enclosed in a single housing.

4. An enclosure in accordance with claim 3 wherein said synthetic jet assembly comprises a plurality of synthetic jet ejectors coupled together in serial flow communication.

5. An enclosure in accordance with claim [1] *3* wherein said synthetic jet [ejector comprises] *ejectors each comprise* a piezoelectric actuator, said actuator configured to vibrate such that a flow of fluid is generated.

6. An enclosure in accordance with claim [1] *3* wherein at least one of said plurality of sidewalls comprises an extended surface, said jet port aligned at least one of perpendicularly and obliquely with a surface of said extended surface.

[7. A method of increasing cooling of an enclosure, said method comprising coupling a synthetic jet assembly to an external surface of at least one of a plurality of sidewalls of the enclosure, the synthetic jet assembly including at least one synthetic jet ejector including a jet port, the jet port being aligned at least one of perpendicularly, parallelly, and obliquely with a surface of the at least one sidewall, the synthetic jet assembly being configured to direct a jet of fluid through the jet port at least one of substantially parallel to the surface, perpendicularly onto the surface, and obliquely toward the surface, such that the jet of fluid flows external to the enclosure.]

8. A method in accordance with claim [7] *9* wherein coupling a synthetic jet assembly comprises coupling a synthetic jet assembly having a plurality of jet ports.

9. [A method in accordance with claim 7] *A method of increasing cooling of an enclosure, said method comprising coupling a synthetic jet assembly to an external surface of at least one of a plurality of sidewalls of the enclosure, the synthetic jet assembly including at least one synthetic jet ejector including a jet port, the jet port being aligned at least one of perpendicularly, parallelly, and obliquely with a surface of the at least one sidewall, the synthetic jet assembly being configured to direct a jet of fluid through the jet port at least one of substantially parallel to the surface, perpendicularly onto the surface, and obliquely toward the surface, such that the jet of fluid flows external to the enclosure;* wherein coupling a synthetic jet assembly comprises coupling a synthetic jet assembly having a plurality of synthetic jet ejectors enclosed in a single housing.

10. [A method in accordance with claim 7] *A method of increasing cooling of an enclosure, said method comprising coupling a synthetic jet assembly to an external surface of at least one of a plurality of sidewalls of the enclosure, the synthetic jet assembly including at least one synthetic jet ejector including a jet port, the jet port being aligned at least one of perpendicularly, parallelly, and obliquely with a surface of the at least one sidewall, the synthetic jet assembly being configured to direct a jet of fluid through the jet port at least one of substantially parallel to the surface, perpendicularly onto the surface, and obliquely toward the surface, such that the jet of fluid flows external to the enclosure;* wherein coupling a synthetic jet assembly comprises coupling a synthetic jet assembly having a plurality of synthetic jet ejectors coupled together in serial flow communication.

11. A method in accordance with claim [7] *9* wherein said synthetic jet [ejector comprises] *ejectors each comprise* a piezoelectric actuator, the actuator configured to vibrate.

12. [A method in accordance with claim 7] *A method of increasing cooling of an enclosure, said method comprising coupling a synthetic jet assembly to an external surface of at least one of a plurality of sidewalls of the enclosure, the synthetic jet assembly including at least one synthetic jet ejector including a jet port, the jet port being aligned at least one of perpendicularly, parallelly, and obliquely with a surface of the at least one sidewall, the synthetic jet assembly being configured to direct a jet of fluid through the jet port at least one of substantially parallel to the surface, perpendicularly onto the surface, and obliquely toward the surface, such that the jet of fluid flows external to the enclosure;* wherein at least one of said plurality of sidewalls comprises an extended surface and wherein coupling a synthetic jet assembly comprises aligning the jet port at least one of perpendicularly and obliquely with a surface of the extended surface.

[13. An electronic component system comprising:

a component enclosure comprising a plurality of sidewalls defining a volume;

a heat generating component positioned within the volume; and a synthetic jet assembly comprising a housing formed integrally with and positioned adjacent an external surface of at least one of the plurality of sidewalls, said synthetic jet assembly including at least one synthetic jet ejector comprising a jet port, said jet port aligned at least one of perpendicularly, parallelly, and obliquely with a surface of said at least one sidewall, said synthetic jet assembly is configured to direct a jet of fluid through said port at least one of substantially parallel to said surface, perpendicularly onto said surface, and obliquely toward said surface, such that the jet of fluid flows external to the volume.]

14. An enclosure in accordance with claim [13] *15* wherein said synthetic jet assembly comprises a plurality of jet ports.

15. [An enclosure in accordance with claim 13] *An electronic component system comprising:*

*a component enclosure comprising a plurality of sidewalls defining a volume;*

*a heat generating component positioned within the volume; and*

*a synthetic jet assembly comprising a housing formed integrally with and positioned adjacent an external surface of at least one of the plurality of sidewalls, said synthetic jet assembly including at least one synthetic jet ejector comprising a jet port, said jet port aligned at least one of perpendicularly, parallelly, and obliquely with a surface of said at least one sidewall, said synthetic jet assembly is configured to direct a jet of fluid through said port at least one of substantially parallel to said surface, perpendicularly onto said surface, and obliquely toward said surface, such that the jet of fluid flows external to the volume;* wherein said synthetic jet assembly comprises a plurality of synthetic jet ejectors enclosed in a single housing.

*16. An enclosure in accordance with claim 17 wherein the synthetic jet assembly comprises a plurality of jet ports.*

*17. A component enclosure comprising:*

*a synthetic jet assembly coupled to an external surface of at least one of a plurality of sidewalls of the enclosure, the synthetic jet assembly including at least one synthetic jet ejector including a jet port, the jet port being aligned at least one of perpendicularly, parallelly, and obliquely with a surface of the at least one sidewall, the synthetic jet assembly being configured to direct a jet of fluid through the jet port at least one of substantially parallel to the surface, perpendicularly onto the surface, and obliquely toward the surface, such that the jet of fluid flows external to the enclosure;*

*wherein the synthetic jet assembly comprises a plurality of synthetic jet ejectors enclosed in a single housing.*

*18. A component enclosure comprising:*

*a synthetic jet assembly coupled to an external surface of at least one of a plurality of sidewalls of the enclosure, the synthetic jet assembly including at least one synthetic jet ejector including a jet port, the jet port being aligned at least one of perpendicularly, parallelly, and*

*obliquely with a surface of the at least one sidewall, the synthetic jet assembly being configured to direct a jet of fluid through the jet port at least one of substantially parallel to the surface, perpendicularly onto the surface, and obliquely toward the surface, such that the jet of fluid flows external to the enclosure;*

*wherein the synthetic jet assembly comprises a plurality of synthetic jet ejectors coupled together in serial flow communication.*

*19. An enclosure in accordance with claim 17 wherein the synthetic jet ejectors each comprise a piezoelectric actuator, the actuator configured to vibrate.*

*20. A component enclosure comprising:*

*a synthetic jet assembly coupled to an external surface of at least one of a plurality of sidewalls of the enclosure, the synthetic jet assembly including at least one synthetic jet ejector including a jet port, the jet port being aligned at least one of perpendicularly, parallelly, and obliquely with a surface of the at least one sidewall, the synthetic jet assembly being configured to direct a jet of fluid through the jet port at least one of substantially parallel to the surface, perpendicularly onto the surface, and obliquely toward the surface, such that the jet of fluid flows external to the enclosure;*

*wherein at least one of the plurality of sidewalls comprises an extended surface; and*

*wherein the jet port is aligned at least one of perpendicularly and obliquely with a surface of the extended surface.*

* * * * *